United States Patent
Arjavac et al.

(10) Patent No.: US 6,926,935 B2
(45) Date of Patent: Aug. 9, 2005

(54) PROXIMITY DEPOSITION

(75) Inventors: Jason Harrison Arjavac, Portland, OR (US); Liang Hong, Hillsboro, OR (US); Henri Lezec, Strasbourg (FR); Craig Matthew Henry, Aloha, OR (US); John Anthony Notte, IV, Gloucester, MA (US)

(73) Assignee: FEI Company, Hillsboro, OR (US)

( * ) Notice: Subject to any disclaimer, the term of this patent is extended or adjusted under 35 U.S.C. 154(b) by 0 days.

(21) Appl. No.: 10/607,814

(22) Filed: Jun. 27, 2003

(65) Prior Publication Data

US 2004/0261719 A1 Dec. 30, 2004

(51) Int. Cl.$^7$ ............................................. C23C 14/30
(52) U.S. Cl. ........................ 427/596; 427/585; 438/14
(58) Field of Search ................................ 427/596, 585, 427/248.1; 438/14

(56) References Cited

U.S. PATENT DOCUMENTS

| | | | |
|---|---|---|---|
| 5,639,699 A | * 6/1997 | Nakamura et al. | .......... 427/527 |
| 5,885,354 A | 3/1999 | Frosien et al. | |
| 6,758,900 B1 | 7/2004 | Matsui | |
| 2001/0045525 A1 | 11/2001 | Gerlach et al. | |
| 2003/0047691 A1 | 3/2003 | Musil et al. | |
| 2003/0161970 A1 | 8/2003 | Kaito | |

FOREIGN PATENT DOCUMENTS

JP          54-124879 A   *   9/1979

\* cited by examiner

Primary Examiner—Bret Chen
(74) Attorney, Agent, or Firm—Michael O. Scheinberg

(57) ABSTRACT

The present invention provides methods for achieving substantially damage-free material deposition using charged particle (e.g., ion, electron) or light beams for generating secondary electrons to induce deposition in a gas deposition material. Among other things, some of the methods can be used to deposit, with satisfactory throughput, a protective layer over a semiconductor feature without significantly altering the feature thereby preserving it for accurate measurement. In one embodiment, the beam is directed onto an electron-source surface next to the target surface but not within it. The beam is scanned on the electron-source surface causing secondary electrons to be emitted from the electron-source surface and enter the region over the target surface to interact with deposition gas for depositing a desired amount of material onto the target surface. In this way, materials can be deposited onto a the target surface at a suitably high rate without having to expose the target surface, itself, to the beam being used to perform the material deposition. In another embodiment, the beam is directed onto a separate electron generating surface (preferably one that has a relatively high secondary electron emission coefficient) proximal to the target surface for generating the electrons to deposit the deposition material onto the target surface.

25 Claims, 3 Drawing Sheets

PROXIMITY DEPOSITION

TECHNICAL FIELD OF THE INVENTION

The present invention-relates generally to material deposition and in particular, to a scheme for applying material onto a target surface without having to irradiate the target surface.

BACKGROUND OF THE INVENTION

Gas deposition is used in a variety of applications for depositing a material onto a target surface of a work piece such as a semiconductor wafer or magnetic storage media. The materials are deposited for a variety of reasons such as to form thin-film surfaces, silicon barrier layers, and protective coatings for semiconductor feature characterization and analysis. Regarding the latter, cross-sectional slices are cut out from the surface at an area of interest on the wafer to expose an interior, cross-sectional face for imaging. An imaging device such as a scanning electron microscope ("SEM") then images the cross-sectional interface, in order to analyze, characterize, or measure feature dimensions within it. Typically, the cross-sectional slice is removed from an area on the wafer surface that contains at least a portion of a feature of interest such as a polygate or photo-resist line or contact. The protective layer is needed on the surface when the slice is being cut in order to shield the area around the cut and preserve the characteristics of the feature's interior portion that are to be imaged (e.g., for measurement).

A gas deposition material is generally deposited onto a work piece surface in the following manner. A charged particle (or other) beam is applied to the target surface in the presence of a deposition gas. Upon striking the surface, the charged particle beam causes the surface to emit secondary electrons, which interact with the deposition gas causing it to form deposition particulate. As this goes on, the particulate accumulates on the underlying target surface thereby forming the deposition layer. Many combinations of gasses, work piece surfaces and beam types can be used to achieve a variety of deposition schemes. For example, commonly used deposition gasses include those that contain tungsten, platinum, gold, and carbon for depositing the same onto the target surface. The particular material to be deposited will usually depend on the application, underlying target surface, and how the material reacts with the same. Similarly, a variety of beam types can be used to generate secondary electrons. These include ion, electron, and laser beams. Depending on the target surface material and its secondary electron emission coefficient in connection with the particular beam type and parameters, any of these beam types may be preferred in a given application. With feature characterization and measurement applications involving silicon based wafers, a tungsten gas with a gallium ion beam are commonly used to apply tungsten as the protective layer over the target surface.

FIG. 1A is a top view of a semiconductor wafer 100 that includes a line feature 105. In order to measure aspects of the line feature in the Z-axis, a cross-sectional slice is typically cut away from the feature 105 and wafer surface (along the X-axis) to obtain a cross-section for measuring X-Z characteristics of the feature. Typically, a focused ion beam ("FIB") is used to cut away the cross-sectional sliced. A SEM is then normally used to measure the X-Z characteristics of the feature's cross-sectional face. In fact, dual beam systems with both a FIB and a SEM are commonly used in the semiconductor industry to more efficiently perform these functions with a single device. However, as it is well known in the art, while FIB beams work well for efficiently cutting away cross-sectional slices, they are typically not "clean" enough to cut the slice without damaging at least part of the surrounding area including important aspects of the feature to be measured. Thus, a protective deposition layer, as discussed above, is deposited on the wafer 100 and feature 105 surfaces before cutting away the cross-section.

With reference to FIG. 1B, it is common to use the FIB, itself, for depositing the protective layer. Since it is used for cutting away the cross-sectional slice, it is already in place to irradiate the target surface for depositing the deposition layer. To do this, the FIB beam 103 is scanned over the target surface including the relevant wafer and feature surfaces, in the presence of a suitable deposition gas 120 diffused proximal to the target surface, to deposit the protective material onto both the feature and wafer surfaces within the target surface. Upon striking the target surface, the FIB beam 103 causes secondary electrons, e, to be emitted in all directions from the point on the target surface that is struck by the beam. The electrons interact with the gas causing a particulate to form and be deposited onto the surface below. As shown in FIG. 1C, when the process is completed, a protective layer 125 formed from the deposited particulate results over the target surface.

Unfortunately, when the FIB is initially scanned onto the target surface, it sputters material away from the surface for a period of time until a sufficient amount of deposition material accumulates to shield the exposed feature surface from the FIB. Even though this time may be small;, it can be large enough to allow a significant amount of material to be removed, which causes the accuracy of the cross-sectional analysis to be compromised. For example, as shown in FIG. 1C, the line feature 105 becomes fairly rounded at its upper, outside edges, which incur the greatest un-shielded exposure to the FIB. This can be highly problematic, especially with decreasingly smaller dimensions and tolerances used in today's chip manufacturing processes. For example, with the depicted "rounded" line feature, its width might incorrectly measure as being small enough for the line feature to wrongfully be characterized as being out of tolerance.

As mentioned above, electron and laser beams can be used to generate the electrons necessary for material deposition, but they may also damage the underlying surface—especially when they are at sufficient energy and/or current density levels for achieving favorable throughput. However, it is normally not practical to use them because they will typically be too slow if "weak" enough not to harm the underlying surface. Moreover in many environments such as in dual beam systems, for example, they are not properly aligned for scanning the target surface at suitable angles for gas depositioning. Plasma vapor deposition ("PVD") sputter methods could be acceptable in some applications, but they normally cannot be utilized for FAB production control applications because they cannot be used to locally apply a deposition layer onto a targeted part of the wafer surface.

Accordingly, what is need is an improved method and system for depositing materials onto a target surface.

SUMMARY OF THE INVENTION

The present invention provides methods for achieving substantially damage-free material deposition using charged particle (e.g., ion, electron) or light beams for generating secondary electrons to induce deposition in a gas deposition material. Among other things, some of the methods can be used to deposit, with satisfactory throughput, a protective layer over a semiconductor feature without significantly altering the feature thereby preserving it for accurate measurement. In one embodiment, the beam is directed onto an electron-source surface next to the target surface but not within it. The beam is scanned on the electron-source surface causing secondary electrons to be emitted from the electron-source surface and enter the region over the target surface to interact with deposition gas for depositing a desired amount of material onto the target surface. In this way, materials can be deposited onto a the target surface at a suitably high rate without having to expose the target surface, itself, to the beam being used to perform the material deposition. In another embodiment, the beam is directed onto a separate electron generating surface (preferably one that has a relatively high secondary electron emission coefficient) proximal to the target surface for generating the electrons to deposit the deposition material onto the target surface.

The foregoing has outlined rather broadly the features and technical advantages of the present invention in order that the detailed description of the invention that follows may be better understood. Additional features and advantages of the invention will be described hereinafter. It should be appreciated by those skilled in the art that the conception and specific embodiment disclosed may be readily utilized as a basis for modifying or designing other structures for carrying out the same purposes as the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, the following description is made with reference to the accompanying drawings, in which.

DETAILED DESCRIPTION OF THE PREFERRED EMBODIMENTS

Figure 1A:
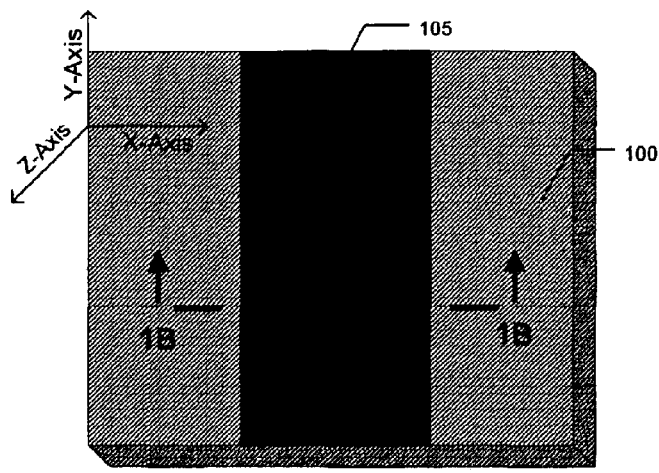
FIG. 1A is a top view diagram of a wafer surface with a line feature.
Figure 1B:
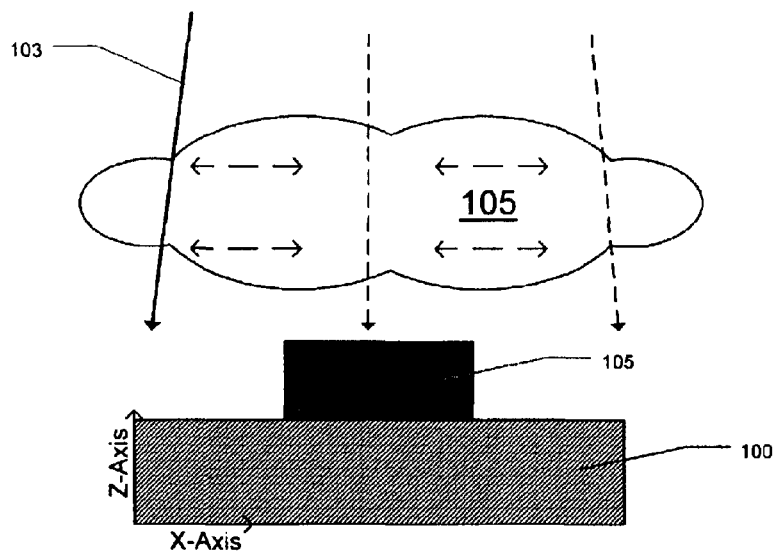
FIG. 1B is a cross-sectional view of the wafer and line feature taken along line 1B—1B of FIG. 1A.
Figure 1C:
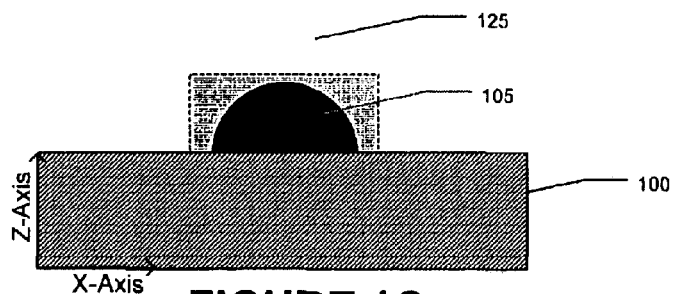
FIG. 1C is a cross-sectional view of the wafer/feature of FIGS. 1A and 1B after having a layer of deposition material deposited onto, it using a conventional gas deposition process.
Figure 2:
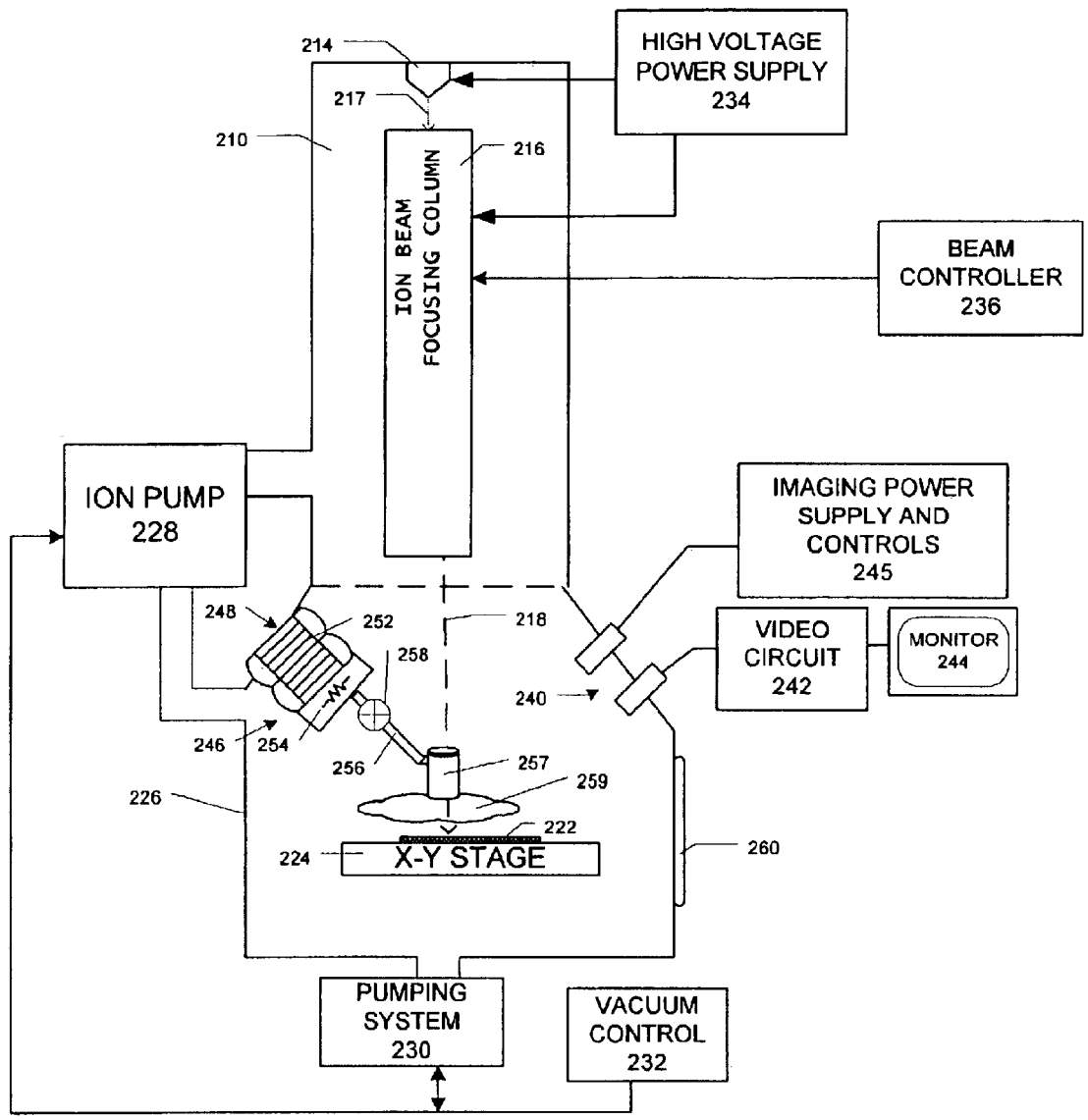
FIG. 2 is a schematic diagram of a FIB system suitable for implementing one embodiment of the deposition method of the present invention.

FIG. 2 schematically shows one embodiment of a focused ion beam ("FIB") system suitable for practicing various embodiments of the proximity deposition method of the present invention. Note that the identified components are not required in all applications. Moreover, the depicted sizes and relative positions are not necessarily to scale or consistent with all configurations.

The depicted FIB system includes an evacuated chamber 210 having a liquid metal ion (e.g., Gallium) source 214 that generates ions 217 into a focusing column 216, which includes a conventional optical system having electrostatic lenses, electrodes (steering, deflection, etc.), and possibly other components for producing a desired focused ion beam 218 and focusing it onto a target work piece 222. Skilled persons will understand that the lenses and other "optical" elements used with focused ion beams use electrostatic or magnetic fields to control ions in the beam, and that the optical elements are controlling a stream of ions. Also, the designs may include only one or up to several lenses.

Ion beam 217 passes from source 214 through column 216 where it is focused into focused beam 218 and directed toward a desired point on work piece 222, which is removably mounted on movable X-Y stage 224 within the lower portion of chamber 226. The work piece 222 can be any material-that may be worked upon by beam 218 to achieve a desired result. It could comprise, for example, a semiconductor device, photo-lithographic mask, magnetic storage head, and the like. The particular type (e.g., shaped/unshaped, size, material) of beam that is used will depend on the object material, as well as on the result that is desired. For example, a tightly focused de-magnified beam with high current may be desired, or alternatively, an under-focused shaped beam (or other shaped beam for that matter) having a favorable current distribution profile may be most appropriate.

An ion pump 228 is employed for evacuating neck portion 210. The chamber 226 is evacuated with turbo-molecular and mechanical pumping system 230 under the control of vacuum controller 232. High voltage power supply 234 is connected to liquid metal ion source 214, as well as to appropriate electrodes in focusing column 216 for forming a suitably charged (e.g., 5 KeV to 30 KeV) ion beam 218 and directing the same downwardly. Controller 236 is coupled to the focusing column 216 in order to control beam 218, for example, to scan, rotate, deform, and/or re-position it on the target work piece 222 in accordance with a desired deposition task. Through controller 236, a user can control beam 218 to be scanned in a desired manner through commands entered into a conventional user interface (not shown). Alternatively, controller 236 may access a memory storage device to download instructions causing the controller to control the system to scan a path for depositing material onto a desired region of the work piece without detrimentally exposing it to the ion beam 218.

The source 214 typically provides a metal ion beam of gallium, although other ion sources, such as a multi-cusp or other plasma ion source, can be used. The liquid Gallium source is typically capable of being focused into a sub one-tenth micron wide beam at work piece 222, An electron multiplier 240 used for detecting secondary emission for imaging is connected to a power supply and controls 245 and to video circuit 242, which supplies drive for video monitor 244 for viewing work piece 222 as it is being worked upon.

A gas source 246 is located inwardly of the side of chamber 226 by translation device 248 adapted for positioning the source via support structure within bellows 252. Gas source 246 includes a reservoir 254 with a heater, which may comprise a membrane type heating device and can be used for raising the temperature of a compound within reservoir 254 to a temperature for providing a suitable stream of molecules 259 for beam-induced reactions to form particulate material deposited onto the work piece 222. A transfer tube or nozzle 256 comprising a capillary tube provided by a hypodermic needle extends from reservoir 254 through control valve 258 to a nozzle end 257 for directing gas vapor 259 onto the work piece 222 proximal to the ion beam 218, which passes through the cylindrical shaped nozzle end 257 as shown in the figure. Valve 258 is adapted for allowing the system to controllably release the gaseous vapor 259.

When reservoir 254 is raised to a desired temperature for vaporizing the gas vapor compound 259, valve 258 may be opened by withdrawing an actuator rod from outside the apparatus to open and regulate the position of valve plunger, while the tube nozzle 257 is directed towards the desired area of the work piece 222. Bellows 252 accommodate movement of the nozzle assembly and reservoir relative to the sample without affecting the vacuum within chamber 26. The gas vapor compound 259 can be any suitable deposition gas that meets predefined objectives in connection with the utilized work piece and ion (or other beam type) source. In one embodiment, when a Gallium source is used, a gas comprising tungsten hexi-carbonal ($W[CO]_6$) is used. When this gas interacts with electrons over the target work piece 222, a deposition particulate primarily composed of tungsten but also containing gallium is formed and works well for protecting conventional silicon-based semiconductor materials.

A door 260 is opened for inserting work piece 222 on stage 224, which may be heated, and also for servicing the reservoir 254. The door is interlocked so that it cannot be opened if the temperature in reservoir 254 is substantially above room temperature. A gate valve, schematically illustrated at 262, is closed before door 260 can be opened to seal off the ion source and focusing column apparatus.

The vacuum control system along with the heater of gaseous vapor source 246 are operated to provide an appropriate vapor pressure condition for establishing a gaseous vapor flux in the chamber as directed toward substrate 222 for depositing material. To establish a given gaseous flux, the reservoir is heated to a predetermined temperature.

The high voltage power supply 234 provides an appropriate acceleration voltage to electrodes in ion beam column 216 for energizing and focusing ion beam 218. When it strikes the work piece having condensed gaseous vapor adhered thereupon, the ion beam provides energy for initiating a reaction between the gaseous compound and the substrate for material deposition upon the work piece.

As mentioned earlier, the vacuum system provides a vacuum of between approximately $1 \times 10^{-7}$ Torr and $5 \times 10^{-4}$ Torr within chamber 226. With emission of gaseous vapor, the chamber background pressure is suitably about $1 \times 10^{-5}$ Torr. In an exemplary embodiment, the gaseous source 246 is heated to a temperature for providing an appropriate gaseous flux via the capillary tube of the hypodermic needle, while the metal ion source and focusing column are suitably controlled for generating a corresponding appropriate ion flux. Skilled persons can readily determine appropriate pressures and gas flows for any particular application.

Proximity Deposition

In one embodiment of the invention, substantially damage-free material deposition on a targeted surface is achieved using a charged particle (e.g., ion, electron) or light beam with sufficiently high energy and/or current density for generating secondary electrons from an electron-source surface to induce vapor deposition over a target surface that is adjacent to the electron-source surface without having to directly irradiate the target surface. With this method, any particle or light beam with sufficiently high energy, current, and/or current density for generating a suitable over-flow of secondary electrons can be utilized. Such beams could include but are not limited to electron beams, ion (e.g., FIB) beams and laser beams that can be directed onto a electron-source surface to generate secondary electrons while avoiding the target surface. For simplicity, a FIB beam is used herein to describe these methods, but persons of skill will recognize that other beams could also be used. (For example, electron beams work well for generating secondary electrons, especially when they have sufficient energy and current. In one embodiment, electron beams having energies of between 300 eV and 3 Kev with current values in excess of 1 nA are used are used for depositing materials onto semiconductors)

A target surface is initially defined for receiving a material deposition layer. The target surface will generally comprise at least portions of one or more features of interest (e.g., for measurement or analysis), along with surrounding wafer substrate surface. The target surface should be large enough to adequately prevent important parts of the one or more features from being hit by the FIB, but at the same time, it should be small enough (and/or have a suitable geometric shape) for allowing the secondary electrons to adequately penetrate the target surface region for inducing sufficient material deposition.

Once the target surface has been identified, the electron-source surface is defined for providing the secondary electrons. The electron-source region is normally adjacent to the target surface. It should be large enough and suitably shaped to create an acceptable amount of secondary electrons overflowing into the target surface region. It will typically be desirable to define a electron-source region with a substantially uniform shape around the target surface so that secondary electrons can more evenly be imparted into the target surface region, which results in a more uniformly deposited layer of material. (It should be recognized, however, that substantial uniformity is difficult to achieve because the concentration of secondary electrons decreases as the distance away from a beam incidence point increases, and the amount of material deposition at a given point is proportional to the concentration of available electrons at that point. Thus, points in the target surface having average greatest distances away from beam incidence points in the electron-source surface will have thinner deposits of material.) Inmost cases, it will be desirable to have a closed electron-source surface encompassing the target surface, but they certainly need not encompass the target surface in al cases. IN addition, an electron-source surface can have any appropriate shape such as rectangular, elliptical, and triangular.

Finally, deposition gas is supplied to and diffused within the target surface region, and at the same time, the FIB beam is scanned through the electron-source surface to generate secondary electrons for the target surface area. An example using a semiconductor wafer with several line features will now be discussed.

FIGS. 3A through 3D show a wafer substrate 300 with line features 305A/E in various stages of material deposition according to one embodiment of the present invention. These line features, are in a region of densely disposed line conductors in one of the dies of the WAFER 300. In this example, the inner three line features, 305B, 305C, and 305D, are to be measured. (The first and fifth lines: 305A and 305E, are included in the target area as buffers to better ensure that the features of interest, 305 B/D, are protected from ion over-shoot.) It is desirable to measure the depths and interior widths of a representative sample of the lines during the chip manufacturing process in accordance with many quality control procedures. One benefit of the invention is that by being able to use a FIB in a dual beam system to deposit the protective material, as well as to cut the cross-section for analysis, the measurements can be efficiently performed in the FAB right on the production line if so desired. In addition, unlike with PVD processes that are not capable of targeted material deposition, with FIB deposition methods, only a single die on the wafer need be destroyed in the measurement process. Thus, the wafer, with its remaining chip dies, can go back on the line for further processing and commercialization.

Figure 3A:
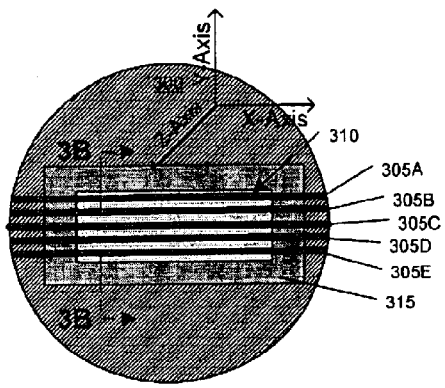
FIG. 3A is a top view showing a wafer with a target surface having several line features.
Figure 3B:
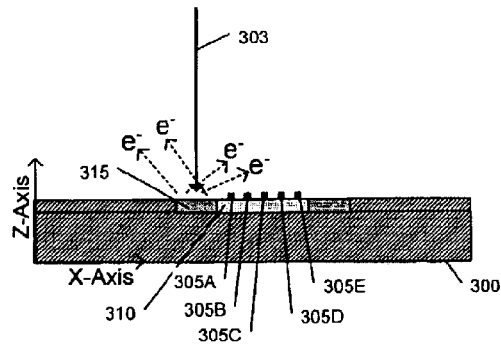
FIG. 3B is a cross-sectional view of the wafer of FIG. 3A showing FIB irradiation for performing an embodiment of the vapor deposition method of the present invention.

With reference to FIGS. 3A and 3B, the wafer surface has a rectangular shaped target surface 310 surrounded by a rectangular-frame shaped electron-source surface 315. While not shown exactly to scale, the width (Y-axis) of each line feature 305A/E is about 0.2 $\mu$m with the spaces between them also BEING about 0.2 $\mu$m. Thus, the width of the depicted target surface 310 is about 2.0 $\mu$m. FIG. 3B shows a cross-sectional view of wafer 300. It shows a FIB beam 303 directed to a point on the left part of the electron-source surface 315. As is shown, secondary electrons, e, project in all directions away from the beam incidence point.

In this example, only the middle three line features (305B, 305C, and 305D) are measured. The particular target surface is defined, however, to encompass five lines as a compromise between the desire on one hand to adequately protect the interior three lines to be measured from FIB ions "over spraying" into the target surface during deposition and on the other hand, to minimize the overall width of the target surface so that secondary electrons can more readily reach all of the points within the target surface.

Figure 3C:
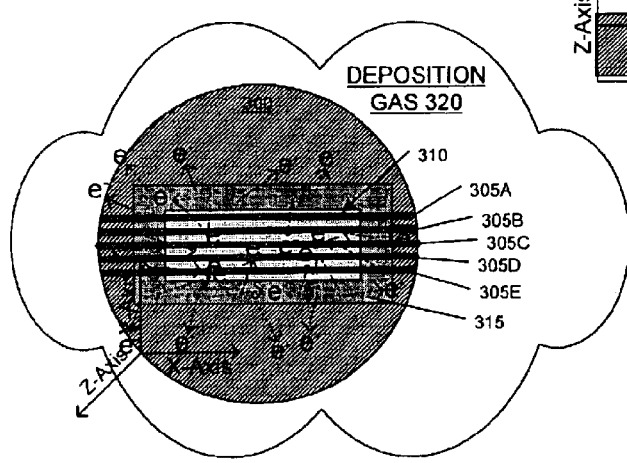
FIG. 3C is a top view of the wafer of FIGS. 3A and 3B illustrating an embodiment of the vapor deposition methods of the present invention.

FIG. 3C shows a top view of the wafer while material is being deposited on it. It shows secondary electrons, e, being emitted, along with supplied deposition gas 320 diffused over the entire area. As is illustrated, the electrons emit in all directions throughout the electron source region 315. It should be recognized, however, that they are not simultaneously emitted from all points on the surface. Rather, they are emitted from the point that is currently being hit by the FIB beam 303 This is why the FIB should be scanned throughout the electron-source surface at a high enough rate to maintain a relatively uniform distribution of electrons within the target surface 310. To scan at a high rate, the beam can be moved from point to point at a fast rate (i.e., dwell times are made small with the beam being quickly moved from point to point), or alternatively, an interlacing type scan pattern can be used whereby different points spread evenly through the electron-source surface are skipped from scan frame to scan frame. Of course, any appropriate combination of these approaches may also be used.

With different applications, different sized electron-source surfaces and target surfaces will likely be used. Accordingly, different beam parameters may be used for different cases depending on process objectives. IN one embodiment, incident beam dwell times from point to point are kept constant while different sized beam currents, current densities, and beam spot diameters are used. When choosing particular beam parameters; several factors may be considered. The size of the beam spot should usually be determined based on the size and dimensions of the electron-source surface. With larger electron-source surface areas, larger beam spot areas are desirable, so long as the beam spot can adequately "fit" within the tightest areas of the electron-source surface without hitting the target surface. Beam current and current density, however, should be selected based on the size and dimensions of the target surface, as well as on the -secondary electron emission characteristics of the electron-source surface material. Larger current densities generally cause electrons to be emitted farther and in greater concentrations. Thus, with target surfaces having interior portions that are relatively far away from a nearest beam incident point in an electron-source surface, beams with larger current densities should be used. On the other hand, if current density is too large, excessive material may sputter away from the electron-source surface and adversely affect the transfer of secondary electrons into the target surface region. The quality of the vacuum at the wafer surface also affects how far the secondary electrons will travel. In one embodiment, a 30 $\mu$A beam with a 12.5 nm spot diameter is used for small target surfaces, while a 300 nA beam with a 25 $\mu$m spot diameter is used for larger target surfaces.

Figure 3D:
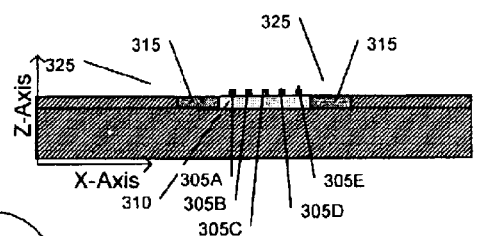
FIG. 3D is a cross-sectional view of the wafer of FIGS. 3A–3C illustrating the features after a deposition layer has been deposited, onto the target surface.

Finally, FIG. 3D shows a cross-sectional view of the wafer 300 after the material 325 has been deposited onto the target surface 315. As can be seen, the material 325 is thickest over the electron source surface where secondary electron density is the greatest. As is expected, material thickness decreases moving away from the electron-source surface. Note that material is also deposited outside of the electron-source surface away from the target surface because material gets deposited wherever there are electrons and deposition gas. Thus, if one wishes to avoid depositing material on restricted areas of the wafer, measures should be taken to either prevent gas from diffusing to the restricted area or ensure that secondary electrons are not imparted to it.

Other Embodiments

Figure 4:
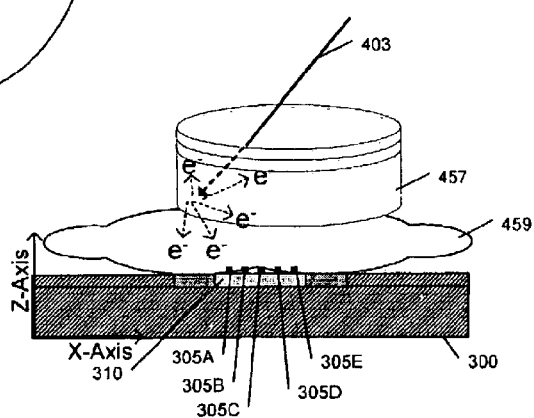
FIG. 4 is a cross-sectional view of a wafer with several line features illustrating another embodiment of the vapor deposition methods of the present invention.

FIG. 4 depicts an alternative scheme for supplying the target surface region with secondary electrons. Instead of directing the depicted FIB beam 403 onto an electron-source surface of the wafer adjacent to the target source 410, it instead is directed to an auxiliary electron-source surface, which in the depicted figure, is the interior metallic surface of a nozzle end piece 457 used for directing the deposition gas 459 onto the wafer. An auxiliary electron-source surface can be any surface not having a common surface with the target surface and that provides secondary electrons for the target surface. For example, it could be a plate, form, or tool adjustably disposed next to the target surface (while gas is being supplied thereupon) for providing secondary electrons in response to being hit with an incident beam. With FIBS, electron beams, and lasers; materials such as metals having high secondary electron emission coefficients are generally desired, but any suitable, available material will suffice. It may be more convenient to use structures (such as gas nozzle ends) that are already proximal to the target surface.

Re-direction devices for channeling secondary electrons toward the target surface may also be utilized. For example, electrostatic and/or magnetic field generation devices may be used. The fields could be static or they could be dynamic to track the incident beam around the electron-source surface. With electrostatic fields, the work piece itself could be used in combination with one or more separate "steering" electrodes or alternatively, separate electrodes could entirely be used for establishing the field. In one embodiment, one or more separate electrodes are configured to create a field encompassing the target surface for channeling the secondary electrons inwardly toward the target surface.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

We claim as follows:

1. A method of depositing a material onto a work piece, comprising:
    identifying target surface on the work piece, the target surface encompassing an area of interest;
    defining an electron-source surface proximal to but substantially exclusive of the target surface;
    providing deposition gas over the target surface; and
    irradiating at least a portion of the electron-source surface to generate secondary electrons projecting into a region over the target surface, said secondary electrons interacting with the deposition gas to deposit a layer of deposition material onto the target surface including the area of interest, said irradiation of at least a portion of the electron-source surface being performed without substantially irradiating the target surface at least until sufficient material is deposited onto the target surface to protect the target surface from irradiation damage, the area of interest in the target surface being substantially undamaged by said irradiation.

2. The method of claim 1, wherein the act of irradiating includes irradiating with an ion beam.

3. The method of claim 1, wherein the act of irradiating includes irradiating with an electron beam.

4. The method of claim 1 wherein the area of interest encompasses a feature to be cross-sectionally analyzed.

5. The method of claim 4, wherein the feature is a line feature disposed substantially along the center of a rectangular shaped target surface.

6. The method of claim 4, wherein the work piece is a wafer having a surface with a feature to be cross-sectionally analyzed the act of identifying a target surface including defining a substantially rectangular shaped surface encompassing a portion of the feature to be analyzed.

7. The method of claim 6, wherein the act of defining an electron-source surface includes defining a surface that substantially surrounds the target surface.

8. The method of claim 1, wherein the act of defining an electron-source surface includes defining a surface that substantially surrounds the target surface.

9. A method of depositing a material onto a work piece,
    identifying a target surface on the work piece, the target surface encompassing an area of interest that encompasses a feature to be cross-sectionally analyzed;
    defining an electron-source surface proximal to but substantially exclusive of the target surface;
    providing deposition gas over the target surface; and
    irradiating at least a portion of the electron-source surface to generate secondary electrons projecting into a region over the target surface, said secondary electrons interacting with the deposition gas to deposit a layer of deposition material onto the target surface including the area of interest, wherein the area of interest in the target surface is not damaged by said irradiation.

10. The method of claim 9, wherein the feature is a line feature disposed substantially along the center of a rectangular shaped target surface.

11. The method of claim 9, wherein the work piece is a wafer having a surface with a feature to be cross-sectionally analyzed, the act of identifying a target surface includes defining a substantially rectangular shaped surface encompassing a portion of the feature to be analyzed.

12. The method of claim 11, wherein the act of defining an electron-source surface includes defining a surface that substantially surrounds the target surface.

13. A method of depositing a material onto a work piece surface, comprising:
    identifying a target surface on the work piece surface;
    providing an auxiliary electron-source surface proximal to the target surface;
    providing deposition gas over the target surface; and
    irradiating at least a portion of the auxiliary electron source surface to generate secondary electrons that travel above the target surface to interact with the deposition gas to deposit a deposition layer over the target surface without substantially irradiating the target surface.

14. The method of claim 13, wherein the act of providing an auxiliary electron-source includes providing an auxiliary electron-source comprising a metallic surface that is part of a device for providing the deposition gas.

15. The method of claim 13, wherein the act of irradiating the auxiliary electron source includes irradiating it with an ion beam.

16. The method of claim 13, wherein the act of irradiating the auxiliary electron source includes irradiating it with an electron beam.

17. The method of claim 13 wherein the target surface encompasses a feature to be cross-sectionally analyzed.

18. The method of claim 17, wherein the feature is a line feature disposed substantially along the center of a rectangular shaped target surface.

19. The method of claim 17, wherein the work piece is a wafer having a surface with a feature to be cross-sectionally analyzed, and the act of identifying a target surface including defining a substantially rectangular shaped surface encompassing a portion of the feature to be analyzed.

20. The method of claim 19, wherein the act of providing an auxiliary electron-source surface includes providing a metallic surface that tracks a scanning beam around the target surface.

21. The method of claim 13, wherein the act of defining an electron-source surface includes defining a surface that substantially surrounds the target surface.

22. A method of depositing a material onto a work piece surface, comprising:
    identifying a target surface on the work piece surface the target surface encompassing a feature to be cross-sectionally analyzed;
    providing an auxiliary electron-source surface proximal to the target surface;
    providing deposition gas over the target surface; and
    irradiating at least a portion of the auxiliary electron source surface to generate secondary electrons emitting over the target surface to interact with the deposition gas to deposit a deposition layer over the target surface.

23. The method of claim 22, wherein the feature is a line feature disposed substantially along the center of a rectangular shaped target surface.

24. The method of claim 22, wherein the work piece is a wafer having a surface with a feature to be cross-sectionally analyzed, and the act of identifying a target surface includes defining a substantially rectangular shaped surface encompassing a portion of the feature to be analyzed.

25. The method of claim 24, wherein the act of providing an auxiliary electron-source surface includes providing a metallic surface that tracks a scanning beam around the target surface.

* * * * *